US011953557B2

(12) United States Patent
Kervinen et al.

(10) Patent No.: US 11,953,557 B2
(45) Date of Patent: Apr. 9, 2024

(54) ARRANGEMENT FOR TESTING ELECTRIC CAR COMPONENTS

(71) Applicant: PROVENTIA OY, Oulunsalo (FI)

(72) Inventors: Harri Kervinen, Oulunsalo (FI); Aaro Heilala, Oulunsalo (FI); Mika Lakso, Oulunsalo (FI)

(73) Assignee: PROVENTIA OY, Oulunsalo (FI)

( * ) Notice: Subject to any disclaimer, the term of this patent is extended or adjusted under 35 U.S.C. 154(b) by 0 days.

(21) Appl. No.: 15/734,665

(22) PCT Filed: Jun. 5, 2019

(86) PCT No.: PCT/FI2019/050429
§ 371 (c)(1),
(2) Date: Dec. 3, 2020

(87) PCT Pub. No.: WO2019/234298
PCT Pub. Date: Dec. 12, 2019

(65) Prior Publication Data
US 2021/0223321 A1 Jul. 22, 2021

(30) Foreign Application Priority Data
Jun. 5, 2018 (EP) .................................. 18175886

(51) Int. Cl.
G01R 31/00 (2006.01)
G01R 31/385 (2019.01)
H01M 10/42 (2006.01)

(52) U.S. Cl.
CPC ......... G01R 31/385 (2019.01); G01R 31/003 (2013.01); H01M 10/4285 (2013.01); H01M 2250/20 (2013.01)

(58) Field of Classification Search
CPC .............. G01R 31/385; G01R 31/003; H01M 2250/20; H01M 10/4285
(Continued)

(56) References Cited
U.S. PATENT DOCUMENTS 5,574,226 A    11/1996  Reuther et al.
5,821,008 A *  10/1998  Harada ............... H01M 50/578
                                                     429/61
(Continued)

FOREIGN PATENT DOCUMENTS

CA      2961997 A1 * 10/2017 ............. G01H 17/00
CN       203930393      11/2014
(Continued)

OTHER PUBLICATIONS

International Search Report for PCT/FI2019/050429 dated Sep. 12, 2019, 6 pages.
(Continued)

Primary Examiner — Alexander Satanovsky
Assistant Examiner — Trung Q Nguyen
(74) Attorney, Agent, or Firm — Nixon & Vanderhye PC

(57) ABSTRACT

An arrangement for testing electric car components is provided. The arrangement includes a transportable container housing at least a test chamber for testing the electric car components; a climate control system for controlling climate conditions in the test chamber of the container; and a test mechanism for testing the electric car components in the test chamber of the container.

13 Claims, 4 Drawing Sheets

(58) Field of Classification Search
USPC .................................................. 324/425–450
See application file for complete search history.

(56) References Cited

U.S. PATENT DOCUMENTS

| | | | |
|---|---|---|---|
| 2002/0088271 | A1 | 7/2002 | Sigwart et al. |
| 2010/0107749 | A1 | 5/2010 | Gushman et al. |
| 2016/0131701 | A1 | 5/2016 | Marcicki et al. |
| 2016/0169789 | A1 | 6/2016 | Chen et al. |
| 2019/0273289 | A1* | 9/2019 | Hahn ................ H01M 10/4285 |

FOREIGN PATENT DOCUMENTS

| | | | |
|---|---|---|---|
| CN | 205027624 | | 2/2016 |
| DE | 196 44 048 | | 5/1998 |
| DE | 20 2006 018 830 | | 4/2007 |
| DE | 10 2013 015 304 | | 3/2015 |
| EP | 0 620 135 | | 10/1994 |
| EP | 1 760 447 | | 7/2010 |
| EP | 2 906 756 | | 8/2015 |
| GB | 2555393 | | 5/2018 |
| WO | WO 2001025745 | * | 4/2001 ............ G01M 15/02 |
| WO | 2014/056548 | | 4/2014 |

OTHER PUBLICATIONS

Written Opinion of the ISA for PCT/FI2019/050429 dated Sep. 12, 2019, 8 pages.
Extended European Search Report for EP 18175886.3 dated Feb. 5, 2019, 17 pages.
International Preliminary Report on Patentability for PCT/FI2019/050429 dated Sep. 29, 2020, 17 pages.
"Environmental Chambers for Battery Testing", Cincinnati Sub-Zero Products, Inc., Jan. 24, 2013, 10 pages.
Sennhauser, "Battery Test Bench", CCEM—Annual Activity Report 2012, Feb. 1, 2013, 1 page.
"Custom design and integrate a complete, turnkey acquisition and control system to automate your tests, record data and monitor all critical parameters—Fully Integrated Portable Test Cells", Emprise Corporation, Aug. 23, 2015, Retrieved from the Internet: https://web.archive.org/web/20150823175934/http://www.emprise-usa.com/portable-test-cells, 3 pages.
Office Action issued in EP Appln. No. 18 175 886.3 dated Dec. 11, 2020.
Anonymous: "Proventia Test Unit is a modular combustion engine test laboratory in a compact shape and structure", EPO Form 2906 01 .91 TRI Proventia, Jan. 1, 2018, XP055441284, URL:https://www.proventia.com/solutions_products/test_solutions/engine_test_units [retrieved on Jan. 16, 2018].

* cited by examiner

ARRANGEMENT FOR TESTING ELECTRIC CAR COMPONENTS

This application is the U.S. national phase of International Application No. PCT/FI2019/050429 filed Jun. 5, 2019 which designated the U.S. and claims priority to EP Patent Application No. 18175886.3 filed Jun. 5, 2018, the entire contents of each of which are hereby incorporated by reference.

FIELD

Various embodiments described herein relate to providing a testing arrangement for testing electric components of cars, such as battery components and electric motors.

BACKGROUND

Manufacturers of electric car components such as engine or battery manufacturers, and/or car manufacturers, require testing facilities for testing the electric car components. The testing may involve testing operation and capabilities of the components under various scenarios, e.g. under different environmental conditions. The testing may involve measuring electric properties of the components in the various scenarios. For that purpose, one or more sensors may be connected to a component under test and further sensors may be disposed in a test chamber where the component is tested.

Conventionally, testing of electric car components such as batteries and electric motors is carried out in special-purpose testing facilities within a manufacturing facility, for example. The testing facilities is built as an integral part of other facilities such as the manufacturing facilities. This results in great investments, long construction times, and lack of flexibility in providing the testing capabilities.

BRIEF DESCRIPTION OF THE INVENTION

The invention is defined by the subject-matter of the independent claim. Embodiments are defined in the dependent claims.

LIST OF DRAWINGS

In the following, the invention will be described in greater detail with reference to the embodiments and the accompanying drawings, in which FIG. 1 illustrates an arrangement for testing electric car components according to an embodiment of the invention;

DESCRIPTION OF EMBODIMENTS

The following embodiments are exemplifying. Although the specification may refer to "an", "one", or "some" embodiment(s) in several locations of the text, this does not necessarily mean that each reference is made to the same embodiment(s), or that a particular feature only applies to a single embodiment. Single features of different embodiments may also be combined to provide other embodiments.

Figure 1:
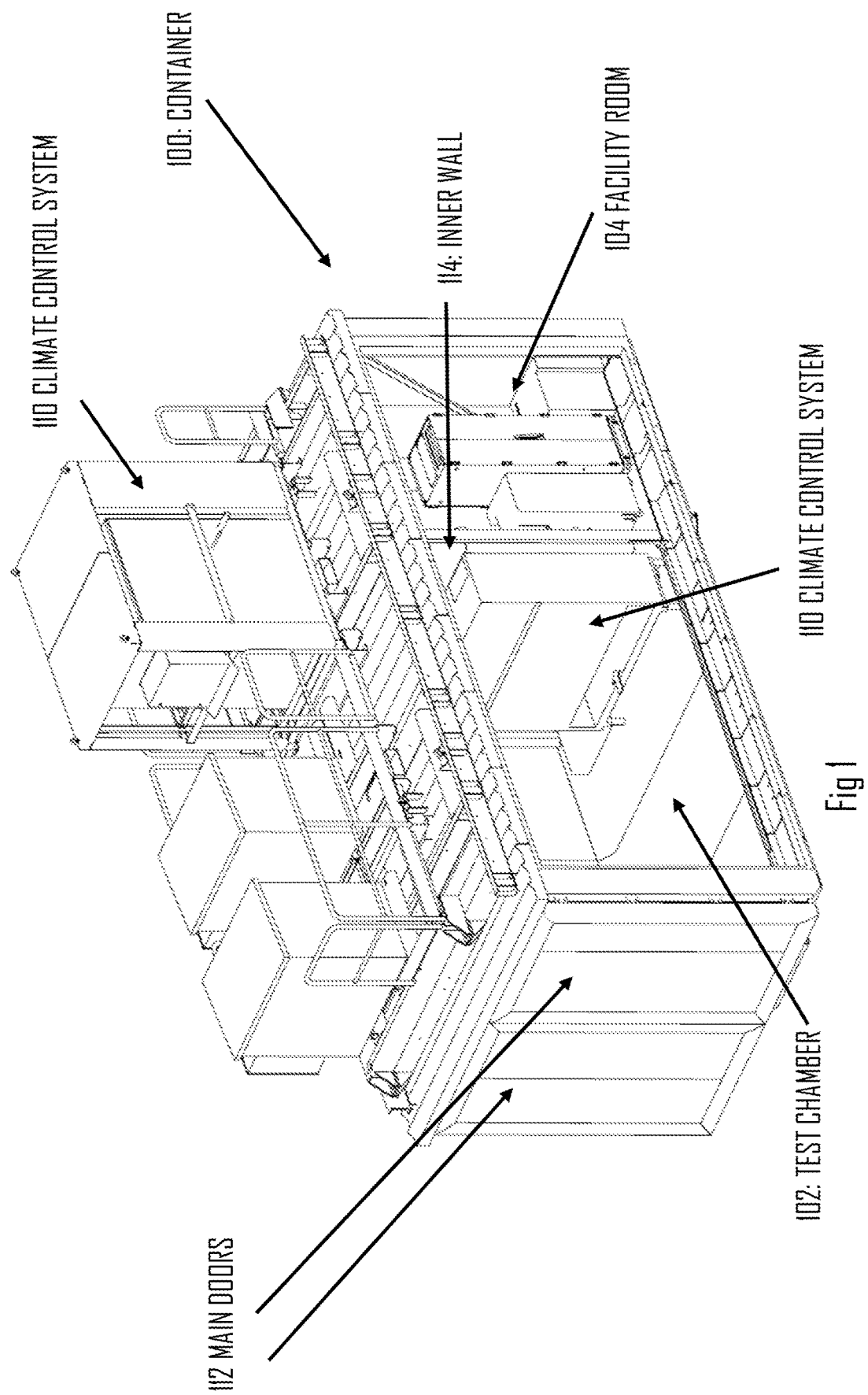

FIG. 1 illustrates an arrangement for testing electric car components according to an embodiment of the invention. Referring to FIG. 1, the arrangement comprises a transportable container 100 housing at least a test chamber 102 for testing the electric car components, a climate control system 110 for controlling climate conditions in the test chamber 102 of the container 100, and means for testing the electric car components in the test chamber 102 of the container 100.

Providing the test chamber 102 in the transportable container provides several advantages. The test chamber is easy to build, modify, transport, replace, and remove. The investments needed are low. One particular advantage related to the ability to provide the test chamber outside the fixed buildings is an outcome in case of a fire or explosion. The electric vehicle components under test may occasionally ignite fire or even explode during the testing. Such a hazard may destroy the container but the damages are typically limited to the container, and the damages can be overcome simply by replacing the container with a new one. The damages in terms of costs and recovery time are significantly shorter compared with a test chamber provided as fixed inside a manufacturing plant, for example. In case of the chamber inside buildings, the extent of the damages may span to building structures that may cause extensive repairs. Such repairs may be complex, expensive, and time-consuming, and the testing may have to be suspended for a long period of time. The present invention provides improvement to all these aspects.

Another advantage in providing the test chamber in the container is that the container may be built to have desired thermal insulation properties that improve safety in case of a hazard and further improve efficiency when performing the environmental testing of the electric components. It also enables modular testing arrangements, as described below, which improves scalability and flexibility in the testing.

In an embodiment, the container is a standard-size freight container. Recent trends toward globalization have hastened the adoption of certain standards to facilitate the exchange of goods. In particular, container-based freight transport allows shippers to manage transport of standard sized containers, with little or no regard from what they might contain. The International Organization for Standardization (ISO) maintains standards of such general-purpose and specific-purpose containers. ISO containers, or containers complying with ISO-standards have fittings in corners of the container to enable lifting and handling the container. The fittings for the top and bottom corners of containers provide compatibility in interchange between transportation modes. The size and configuration of corner fitting apertures are specified. The faces of the corner fittings having apertures for the engagement of handling and securing devices have specified thickness and tolerances. The thickness of the blank walls is not specified since they are not involved in the engagement of the handling and securing devices, provided that their inner surfaces do not protrude into the 5 corner fitting cavity reserved for the engaging devices.

Under the ISO standards, there are five common standard lengths, 20 ft, 40 ft, 45 ft, 48 ft, and 53 ft. Container capacity is often expressed in twenty-foot equivalent units (TEU). For air transport, the International Air Transport Association (IATA) has created a similar set of standards for aluminum container sizes designed for aircraft and associated ground handling equipment. One of the benefits of such intermodal containers is that they can be loaded at one location and delivered to a destination by various modes (e.g., ship, rail, truck) without having to open the containers.

The container 100 may meet one or more of the above-mentioned standards in terms of size and the corner fittings. However, the container 100 may have customized parts such as walls and/or extra beams to provide more structural strength and improved fire-proof capability. The outer walls of the container may contain one or more thermal insulation layers. The walls may have a sandwich structure where a mineral wool layer is provided between inner and outer cover plates of the walls. The test chamber is thus thermally insulated from an exterior of the test chamber.

In another embodiment, the container 100 is custom-made to have a non-standard size and/or shape.

In an embodiment, the electric car components to be tested in the container(s) comprise electric components of an electric car or a hybrid car, the hybrid car comprising both an electric engine and a combustion engine. The hybrid car may be considered as a conventional hybrid car that cannot be recharged or a plug-in hybrid electric car that can be recharged. The electric car components may include car components of a power supply system such as a battery and/or a power generation system such as an electric motor.

In another embodiment, the container and associated testing arrangement described herein in any one of the embodiments is applicable to testing electric vehicle components. The electric vehicle components may include electric components such as electric motors and/or battery components of electric or hybrid engine vehicles such as: a container crane, a forestry vehicle, a wheel loader, or another work machine having wheels or tracks.

The climate control system 110 may be configured to adjust environmental conditions in the test chamber 102 during the testing. The climate control system may further control temperature/humidity distribution and/or air flow in the test chamber. The environmental conditions controlled by the climate control system may include at least one of temperature and humidity. Outside the testing, the climate control system may maintain the environmental conditions comparable to room temperature and/or humidity.

The means for testing the electric car components in the test chamber may comprise test equipment for inputting electric inputs to a component under test, measurement equipment for measuring characteristics of the component during the testing and, in some embodiments, measurement equipment for measuring the environmental conditions in the test chamber during the testing. When the component under test is a battery, the test equipment for inputting the electric input may include at least an interface to a charge/discharge unit configured to input charge/discharge cycles to the battery, e.g. to one or more battery cells of the battery, one or more battery modules of a battery arrangement or a battery pack. The battery may thus be considered as a battery component under test. The test equipment may further comprise a cooling system and/or a heating system configured to cool and/or heat the battery component under test directly during the testing according to a testing protocol. When the component under test is another electric car component, the test equipment for inputting the electric inputs may include at least an interface for inputting test signals to the component under test. The test signals may include control signals for controlling operation of an electric motor, for example.

The measurement equipment for measuring the characteristics of the component under test may include one or more temperature sensors for measuring the temperature of the component under test from one or more locations of the component. The testing may include verification of the temperature durability of the component and/or pinpointing weak parts of the component, e.g. those parts that are particularly susceptible to heat or cold. The measurement equipment may also comprise one or more electric sensors for measuring electric response of the component during the testing, e.g. voltage/current output of a battery. The measurement equipment may comprise one or more electromechanical sensors for measuring mechanical response of the component during the testing, e.g. power and/or torque of the electric motor. Further sensors may measure, for example, pressure of coolant in the component under test.

The measurement equipment for measuring the environmental conditions during the testing may include one or more temperature sensors, one or more air pressure sensors, and one or more humidity sensors for measuring the temperature, pressure, and/or humidity in the test chamber during the testing. The measurements of these sensors may be logged in a test report and/or used as feedback to the climate control system 110 when controlling the environmental conditions during the testing.

In an embodiment, the container 100 comprises a fire-proof inner wall 114 separating an interior of the container 100 into the test chamber 102 and a facility room 104. The facility room 104 may be designed to house equipment needed when carrying out the testing of the electric components. Environmental conditions in the test chamber may be extreme because the climate control system changes the environmental conditions during the testing. For example, the temperatures may range from −50 to +150 degrees Celsius, and humidity may vary from 5 to 95 percent of relative humidity. This puts strict requirements to the test equipment in the test chamber 102 and, therefore, it may be feasible to place those test equipment which are vulnerable to the extreme conditions in the facility room 104 instead of the test chamber 102. The facility room 104 may also function as an operator room where an operator (a staff member) may monitor the testing. The test equipment provided in the facility room 104 may include at least one of the following: a test control system comprising equipment for controlling the testing performed in the test chamber 102, an electric switchboard for coupling electric connections between the test chamber and exterior of the container, a part of the climate control system, an input/output (I/O) board, and at least part of the test equipment for inputting the electric inputs to the component under test.

The test control system may comprise at least one circuitry for controlling the execution of one or more pre-specified testing protocols. The test control system may comprise or have access to a memory storing the one or more testing protocols for the execution. The testing protocols may comprise instructions as how to control the test equipment and the measurement equipment during the testing. The test control system may be configured to monitor the execution of the testing and, in case of certain parameters indicate a safety hazard, the test control system may cancel the testing and initiate safety measures such as fire extinguishers.

The electric switchboard may comprise a plurality of electric interfaces to enable implementations of various testing configurations and, optionally, transform between different electric components inside and outside the container.

The part of the climate control system provided in the facility room 104 may include at least a blower providing air flow to the test chamber 102 and associated electric motor and, optionally, some other electric components that are vulnerable to the extreme conditions of the test chamber 102. The blower may be provided in a cabinet.

The I/O board may comprise a plurality of electric I/O interfaces for providing further inputs to the test chamber and/or outputs from the test chamber. The I/O interfaces may provide an electric interface to one or more temperature sensors in the test chamber for the operator to check the temperature, an interface to an air pressure sensor in the test chamber, one or more analog-to-digital and digital-to-analog converters, a local area network (LAN) interface, a controller area network (CAN) bus interface, etc.

A door may be provided in the inner wall 114 so that the test chamber 102 may be accessed directly from the facility room 104. The container 100 may further comprise main doors 112 that provide access to the test chamber 102 from outside the container 100. The main doors contact a door frame of the container through an insulator. The insulator may be attached to the doors or the door frame, and it functions as a part of thermal insulation needed to allow the climate control system and the whole environmental testing to be performed efficiently. A problem arises when the temperature in the test chamber is sub-zero degrees Celsius: the insulator attaches to both the door frame and the door which may result damages in the insulator, if the door is opened. In order to prevent this from happening, the arrangement may include means for heating a contact surface at the location of the insulator. The contact surface may be a part of the main doors or the door frame, depending from which part the insulator detaches when the main doors are opened. The means for heating may be controlled by the climate control system or the test control system such that the means are activated when the temperature in the test chamber drops below a determined temperature, e.g. below zero degrees Celsius. The heating means may include a thermal resistor or other means.

A further door to the facility room from the exterior of the container may be provided. The further door serves as an emergency exit in case of an emergency.

The container 100 may further comprise a roof interface between the interior of the container 100 and the roof of the container. Referring to FIG. 1, a platform may be constructed on the roof of the container. The platform may comprise one or more beams or girders fixed to the roof of the container. The platform may further comprise grating to enable walking on the platform. The platform may include a support structure for a condenser of the climate control system 110, for example. The connections such as pipes between the interior and exterior units of the climate control system may be arranged through the roof. In an embodiment, the roof interface is provided in the facility room 104. In another embodiment, the roof interface may provide couplings between test equipment contained inside the test chamber and/or the facility room and test equipment provided on the roof structure. For example, some test equipment may require cooling which may be feasible to arrange at the roof structure. In another embodiment, one part of the climate control system is provided in the test chamber while another part of the climate control system is provided on the platform on the roof. The roof interface or another interface may provide couplings between the interior and exterior parts of the climate control system.

In an embodiment, the container 100 comprises an electric interface to electric input/output equipment configured to input electric inputs to an electric component under test comprised in the test chamber. Let us next discuss some embodiments of the electric interface.

Figure 3:
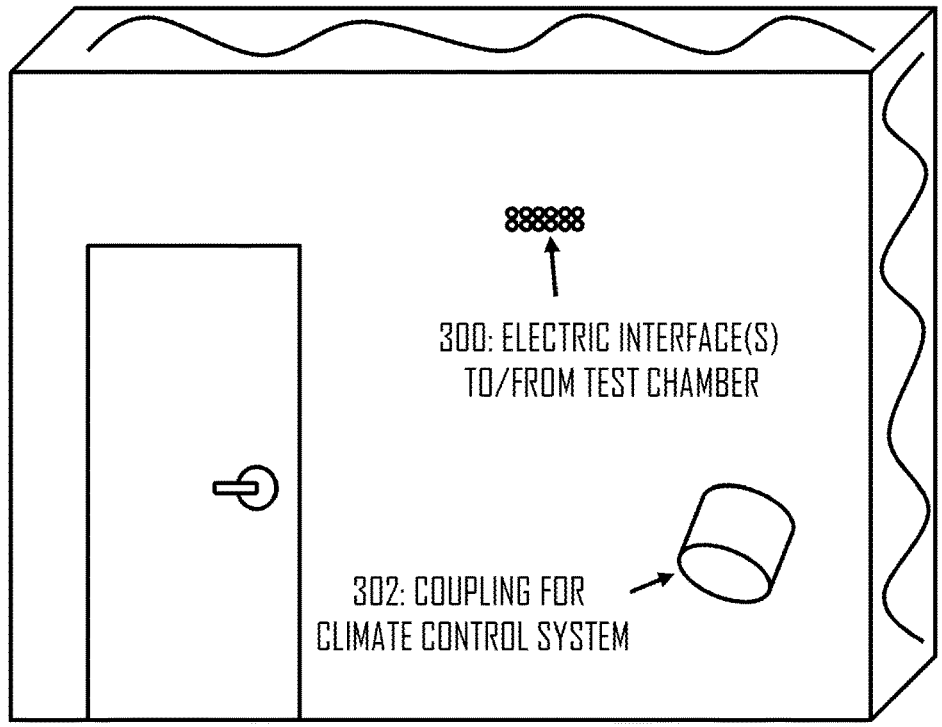
FIG. 3 illustrates an embodiment of an inner wall in the arrangement.

In an embodiment, the electric interface is provided as a connector or a fireproof passthrough in the inner wall. FIG. 3 illustrates an embodiment of the inner wall where electric interfaces 300 to/from the test chamber 102 are provided. In this embodiment, the electric interface is provided inside the container. The electric interfaces 300 may provide connections between the test equipment outside the test chamber 102 and the test or measurement equipment inside the test chamber 102. The electric interfaces 300 and passthroughs in the inner wall may be designed to meet one or more of the following specifications: passes heat less than 0.11 joules per square centimeter ($J/cm^2$), comprises at least 300 millimeters (mm) of mineral wool or at least 100 mm of mineral wool and at least 120 mm of polyurethane in layers.

In an embodiment, an electric interface is disposed in also an exterior wall of the container. Such an electric interface may provide for coupling between electric testing components external to the container. For example, a frequency converter converting a frequency of electric power supply may be provided as external to the container.

Figure 2:
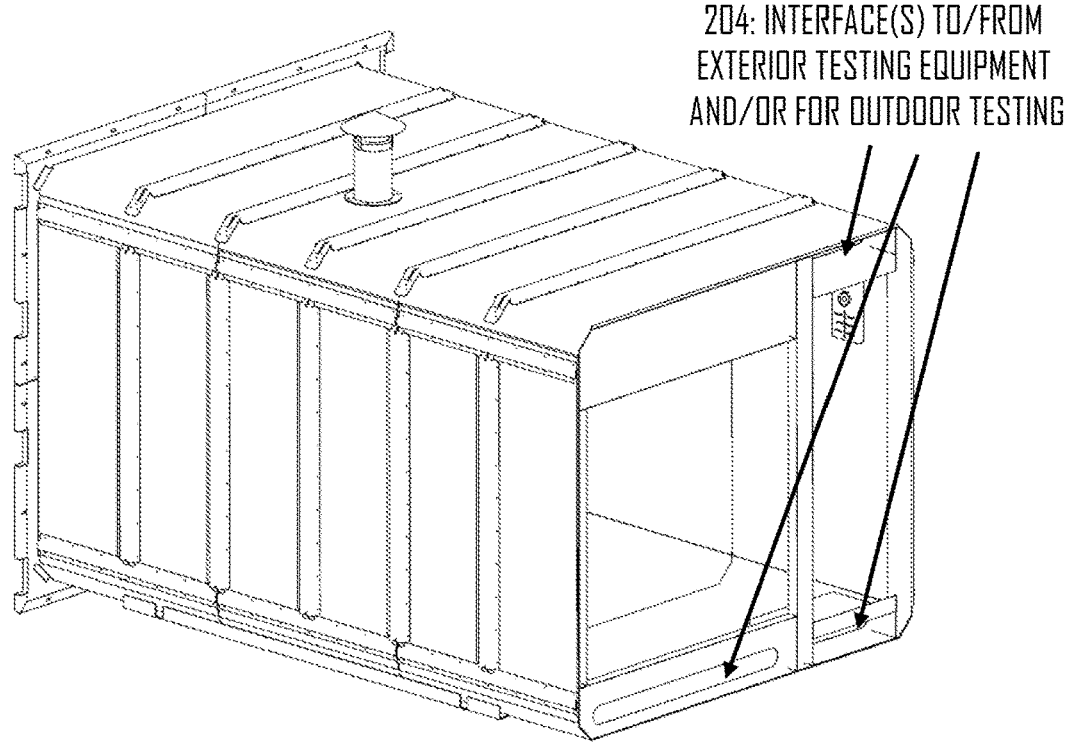
FIG. 2 illustrates a simplified view of an insert comprised in the container according to an embodiment of the invention.

FIG. 2 illustrates an insert to the container, the insert forming the test chamber and, in some embodiments, also the facility room 104. The insert may be inserted inside a frame of the container and form at least some of the inner walls of the test chamber and/or facility room. The insert may comprise one or more interfaces 204 for connections between the test equipment outside the container 100 and the test or measurement equipment inside the container 100, e.g. inside the test chamber 102. For example, the charge/discharge unit may be provided outside the container 100 and the electric interface 204 may provide electric coupling between the charge/discharge unit and the switchboard, for example. The switchboard may then provide further coupling to the test chamber and the component/battery under test. The electric interface 204 may further provide electric coupling to external test control and/or test monitoring systems in order to enable controlling/monitoring the testing outside the container 100. The interfaces 204 may comprise holes or tunnels through which the electric cables may be passed between the interior and the exterior of the test chamber. The couplings such as electric cables and/or tubes between internal and external units of the of the climate control system 110 illustrated in FIG. 1 may be directed through the interfaces 204.

In an embodiment, the container comprises both electric interfaces 300 and 204. For example, the internal wall of FIG. 3 may be provided inside the insert of FIG. 2. In another embodiment, an outer wall of the insert of FIG. 2 operates as the inner wall of FIG. 3.

In an embodiment where the electric car components comprise car batteries, the charge/discharge unit is disposed in the facility room 104 and configured to input charge/discharge cycles to a battery under test.

In an embodiment, all electric cables inside the test chamber are designed to sustain the extreme conditions mentioned above, e.g. extreme temperatures and changes in the temperature and humidity.

The container may be realized in such dimensions that it is suitable for testing electric car components that are smaller than a car, e.g. car batteries or electric motors. The electric car components may thus be removed from the car for testing, be tested before they are installed to the car, or tested in a prototype phase before bringing to production. This allows the container to be easily transportable, and installation of the testing environment is simple and efficient because the walls and the ceiling of the container may be readily complete. In an embodiment, the container may be configured to be suitable for testing the electric car components that have been installed to the car. In such an embodiment, the container comprises an electric interface suitable for testing an electric car component outside the test chamber. The electric interface may include some or all the interfaces necessary for carrying out the testing, e.g. an interface to the charge/discharge unit, an interface to the test equipment including the test control system, and an interface for the measurement equipment. This enables testing scenarios where an electric vehicle or a hybrid electric vehicle such as an (hybrid) electric car is driven next to the container for testing. Accordingly, the testing may be carried out without removing the electric component(s) from the vehicle for the testing purposes. This reduces the testing times for components that are readily fixed in a vehicle. When testing the electric car components outside the test chamber, the climate control system may be disabled during the testing by the test control system, or the climate control system may be configured to maintain temperature and/or humidity that is not related to the testing, e.g. room temperature.

FIG. 3 illustrates an embodiment of the inner wall 114. As described above, the wall may be fireproof and meet determined classification regarding the capability of sustaining fire, e.g European fire classification of constructions such as any one of classes between EI 30 and EI 120. The inner wall may thus contribute in the thermal insulation of the test chamber 102. The inner wall may include the interfaces between the test chamber and the facility room, e.g. the electric interfaces 300. The interfaces may further include a coupling 302 between the units of the climate control system. For example, when the blower is arranged in the facility room, the coupling 302 may include a duct to the test chamber through the wall. The duct may also be arranged to meet the requirements regarding the capability of sustaining fire from the test chamber.

In an embodiment, all electric connections for testing the electric car components are arranged to and from the test chamber through the inner wall 114. The electric connections for the testing may consist of the testing equipment directly needed in the testing, e.g. any inputs/outputs to the component under test, sensor connections used to measure (only) during the testing, etc. This may be an advantageous solution from the construction point of view.

In an embodiment, at least one of inlet and outlet of a safety system is provided from the test chamber directly to an exterior of the container. For example, a pressure relief valve may be arranged to allow relief of pressure from the test chamber to the exterior of the container through a wall or a ceiling of the test chamber. This pressure relief valve may be designed to relief pressure that is caused during normal operation of the testing, e.g. pressures that are below a pressure level that causes damages to the equipment inside the container. The inlet and outlet may (further) comprise a rupture panel or an explosion vent arranged to relief pressure caused by an explosion or another unexpected event occurred in the container. The rupture panel may be provided on and through the roof of the container, e.g. through the ceiling of the test chamber 102. The rupture panel may be covered by a cap against the weather. The cap may be fixed to the container by wires or chains so that the cap will not project and cause damage when the rupture hatch is triggered by the pressure. In embodiments where the platform is constructed on the roof of the container, the rupture hatch may be provided below the platform and covered by at least some elements of the platform, e.g. one or more railings and/or grating of the platform. The element(s) of the platform thus protect the equipment on the platform from the damage that might be caused by the operation of the rupture hatch. As yet another example, a drain may be provided on the floor of the test chamber 102. The drain may contain a valve for controlling the outlet of the liquid from the test chamber. As yet another example, a flooding interface may be provided through a wall of the test chamber. The flooding interface may enable flooding of the test chamber and/or the container from the outside in case of an emergency, for example.

Figure 4:
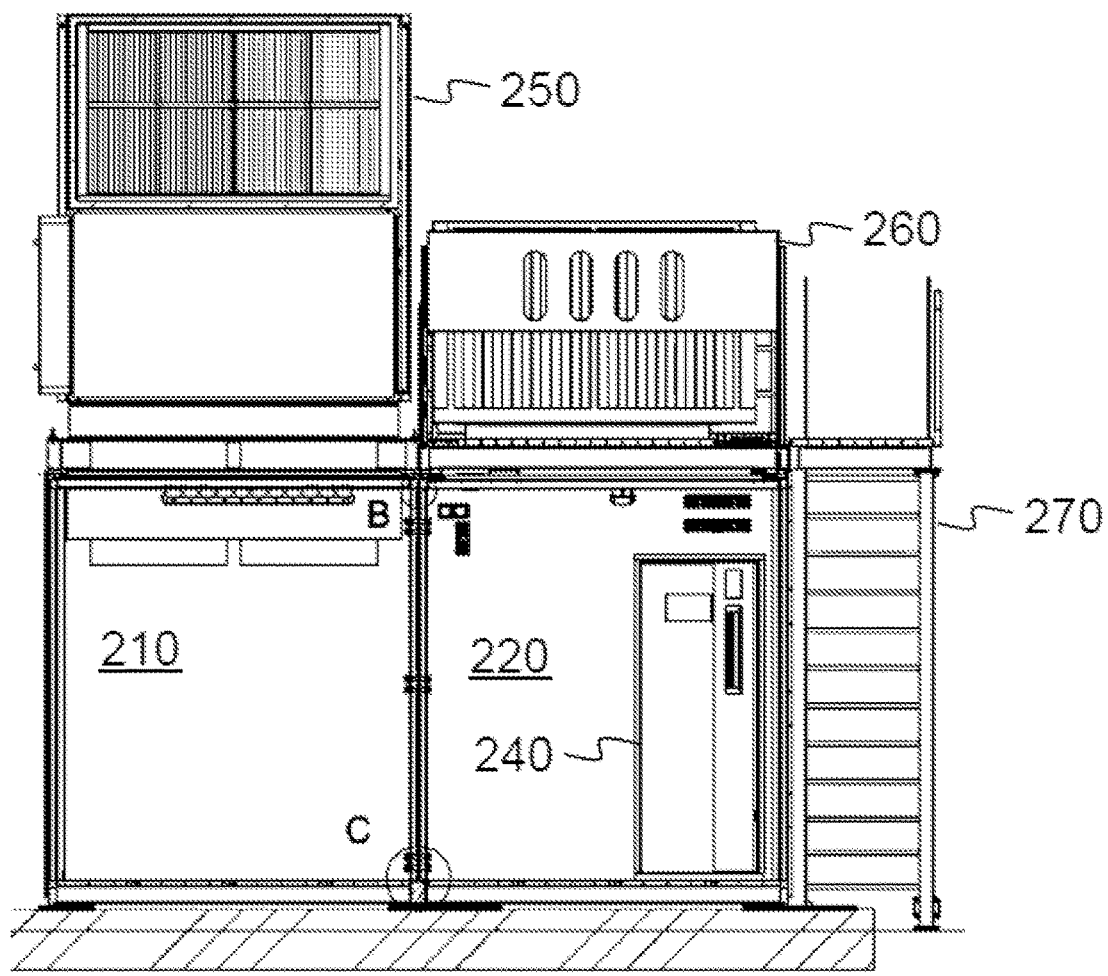
FIG. 4 illustrates an embodiment of the arrangement comprising multiple containers secured together according to an embodiment of the invention.

In an embodiment, the arrangement comprises a further container arranged in parallel with the container 100, wherein the containers are secured to each other via locking means, and wherein at least a portion of side walls of the containers that face each other is removed to provide enlarged test chamber extending at least partially over both containers. FIG. 4 illustrates an embodiment of such an arrangement, wherein the arrangement is shown from an front end view of the container arrangement.

FIG. 4 illustrates two containers 210, 220 joined together. In this embodiment, the containers 210, 220 are joined together from the long side. Interior space may be divided diagonally in two compartments: the test chamber and the facility room. Both the test chamber and the facility room may be considered as one space and a single fire compartment from the fire and safety classification point of view, or the test chamber may be considered as a separate space and a single fire compartment from the fire and safety classification point of view.

In an embodiment, a platform may be arranged below the containers 210, 220 to ease the assembly of the containers 210, 220 as well as dismantling the arrangement. Corners B and C are illustrated for further disclosure relating to the locking means. At least one fire-proof door 240 may be arranged to the arrangement.

In an embodiment, the arrangement may comprise further test equipment 250, 260 placed on the roof of the containers 210, 220. Equipment may also be placed at least partially inside at least one of the containers 210, 220. Furthermore, a ladder or stairs 270 may be arranged externally to the containers 210, 220 to enable test engineers or operators to move around the arrangement. At least one of the external equipment 250-270 may be exchangeable and removable to ease up transportation of the mobile container system 100 and to provide easy handling of standard-sized containers.

In an embodiment, automatic fire extinction is arranged to container(s) 100, 210, 220. The automatic fire extinction system may be based on restricting oxygen inside of the test chamber 102 on the level where burning does not happen anymore. This situation is achieved by filling interior space of the container(s) with inert gas and by closing all openings, including doors and air ducts.

The arrangement may be equipped with automatic fire suppression system. Such system may, for example, consist inert gas tanks and piping that are installed inside assuring an effective and safe fire suppression method. Other systems like water mist systems may be arranged to further improve the safety. Further components of automatic fire extinction system may comprise automatically closing exit doors (including the main doors) and air ducts.

In an embodiment, the arrangement comprises at least one sensor to provide a fire alarm signal. The test control system may receive the fire alarm signal and automatically control all openings, such as doors and air ducts to automatically close.

Figure 5:
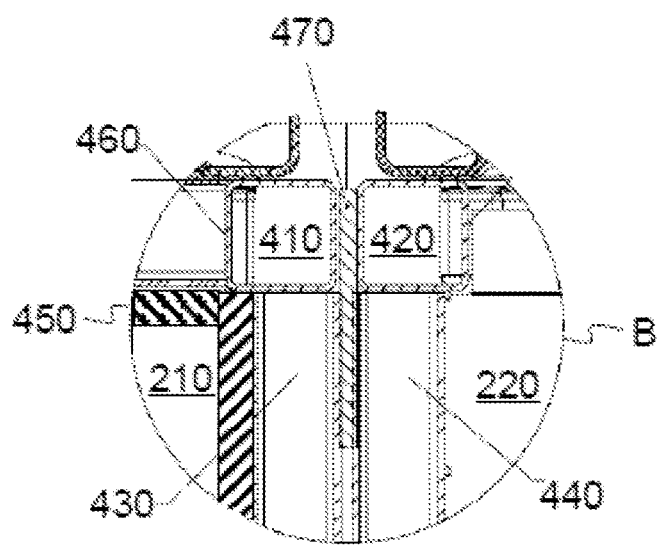
FIG. 5 illustrates an embodiment of structures of the containers in the arrangement of FIG. 4.

FIG. 5 illustrates the area B of FIG. 4 in greater detail. As described above, the first 210 and a second container 220 are releasably securable together by arranging the respective containers 210, 220 in parallel and securing the container with the locking means. Each container 210, 220 may comprise external corners (not shown) of a determined size and a cuboid metal frame of top side rails 410, 420, and vertical reinforcement beams 430-440 connecting to the top side rails 410, 420. Each container 210, 220 may further comprise ceiling, side walls, floor, a front wall and a rear end. The vertical reinforcement beams 430-440 are configured to provide further support for the cuboid metal frame to carry the additional load placed on top of the container(s). The vertical reinforcement beams 430-440 may be connected via U-shaped elements (not shown in FIG. 5) to the top side rails 410, 420 to provide support for carrying the load on top of the container(s). The vertical reinforcement beams 430-440 may not be parts of the original standard-size containers 210, 220 but added when converting the standard containers for the testing purposes.

In an embodiment, the containers 210, 220 are secured to each other via locking means arranged between at least one of following: between adjacent corners of the containers 210, 220, between adjacent top side rails 410, 420 of the containers 210, 220, or between adjacent reinforcement beams 430, 440 of the containers 210, 220.

Figure 6:
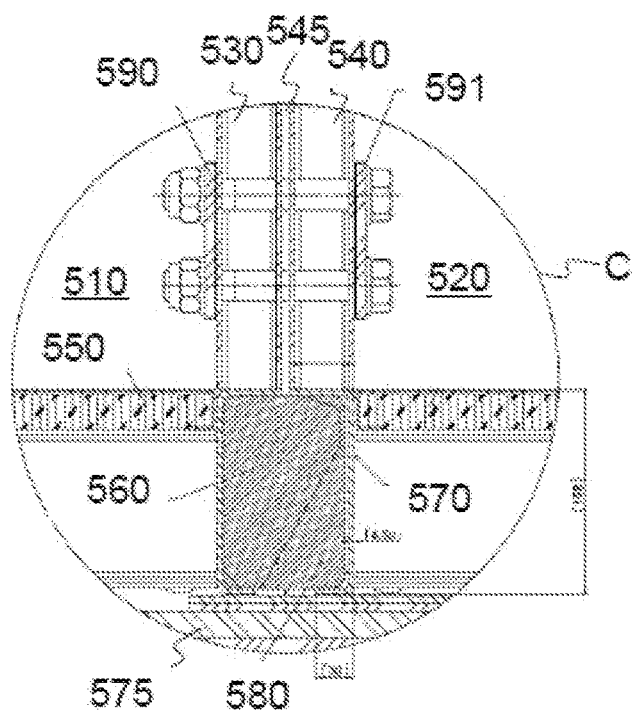
FIGS. 6 and 7 illustrate some embodiments for securing the containers together.

FIG. 6 illustrates the area C of FIG. 3, i.e. between a container floor and a vertical reinforcement beam within the middle part (at least one vertical reinforcement beam between the front wall and the rear end) of the arrangement. This area is illustrated as corner "C" in FIG. 5. A seam between two vertical beams 530, 540 of the adjacent containers 510, 520 in middle part of the containers are sealed with elastic fire-proof sealant 545.

A floor plate 550 may comprise a container frame, such as corrugated steel and a fire-proof element arranged on top of it and comprising mineral wool and a trim panel (inner/upper surface of element 550).

A girder plate 560 may be arranged for leveling floor plates of the adjacent containers 510, 520. The girder plate 560 may be used to guide the containers to be attached with each other when assembling the container system. Furthermore, the girder plate 560 may be arranged to provide a self-supporting floor structure, wherein a floor structure of a first container may be arranged to support a floor structure of a second container. Thus, a floor structure with lighter load may be arranged to support a floor structure with a heavier load, for example.

A bottom side rail 570 of a container may be hollow and comprise the girder plate 560. Furthermore, the hollow bottom side rail may be filled with fire-proof material 580 such as fireproof polyurethane foam. The girder plate 560 may also provide fire-proof blocking plate within the hollow bottom side rail 570 of a container.

Locking plates 590, 591 may be used for locking the reinforcement beams 530, 540 of the adjacent containers 510, 520. Nuts and bolts may be fixed through the locking plates and the adjacent reinforcement beams 530, 540 to secure the containers to each other.

In an embodiment, when assembling the containers 510, 520 together the girder plate 560 is placed to the hollow interior of the bottom side rail 570. The girder plate 560 width may be selected so that it matches the diagonal inner length of the interior of the bottom side rail 570 when assembled. The effect of such selection is that the girder plate 560 guides the containers to be attached with each other and leveling floor plates of the adjacent containers. A platform 575 may be arranged below the containers in order to ease the assembly of the containers as well as dismantling. The platform eases sliding of the second container towards and into contact with the first container. The girder plate 560 may be provided in various shapes, for example triangle-shaped.

Figure 7:
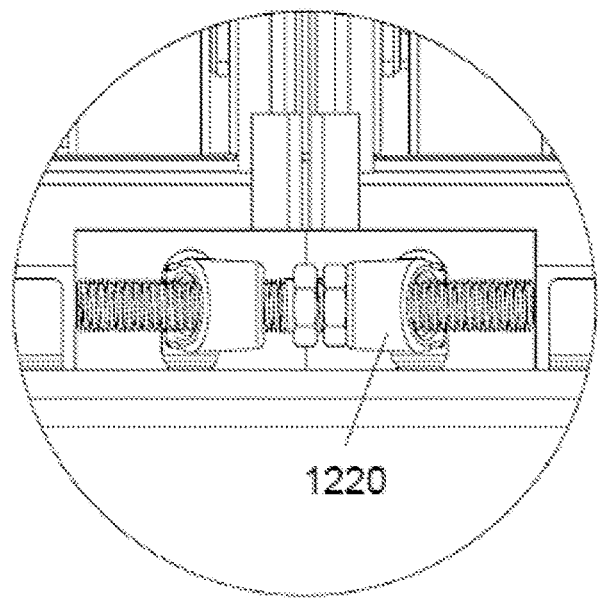

FIG. 7 illustrates another embodiment of area "C" showing container bridge fittings 1220 that secure two adjacent containers using the standard-sized corner fittings of the containers.

In an embodiment, the arrangement for releasably securing a plurality of containers together comprises, as shown in FIG. 7, at least two extension elements emerging from corner fittings of adjacent containers, each extension element configured to be attachable from one end to at least one container and a threaded aperture to be connectable to a securing element, such as a threaded rod. The arrangement further comprises a longitudinal securing element with threads configured to be connected to the threaded aperture of the extension element in releasable and tightenable way. The arrangement may be used for securing containers together as well as for separating the containers form each other. An example of the arrangement comprises one or more container bridge clamps for securing corner fittings of containers together when the containers are adjacent or on top of one another.

The securing element may be arranged so that at least two extension elements of the securing element are fitted to corner fittings of two adjacent containers.

The shape and size of the extension elements and securing elements of the container bridge fittings 1220 may be formed so that the extension elements engage reliably to corner fittings of the containers. The shape may change depending on the corner fitting shape of the containers. Both or all containers may be provided with the same corner fittings and extension elements to facilitate the securing.

Even though the invention has been described above with reference to an example according to the accompanying drawings, it is clear that the invention is not restricted thereto but can be modified in several ways within the scope of the appended claims. Therefore, all words and expressions should be interpreted broadly, and they are intended to illustrate, not to restrict, the embodiment. It will be obvious to a person skilled in the art that, as technology advances, the inventive concept can be implemented in various ways. Further, it is clear to a person skilled in the art that the described embodiments may, but are not required to, be combined with other embodiments in various ways.

The invention claimed is:

1. An arrangement for testing electric components of a car, comprising:
 a transportable freight container housing at least a test chamber for testing the electric components;
 a climate control system configured to control climate conditions in the test chamber of the freight container;
 test equipment configured to test the electric components in the test chamber of the container,
 a substantially planar auxiliary platform constructed on but different from a roof of the freight container, forming a part of a support structure, and
 a roof interface between an interior of the freight container and the roof of the freight container,
 wherein the roof interface provides couplings between the test equipment inside the container and the test equipment provided on the support structure so that sides of the test equipment other than a side of the test equipment adjacent to the support structure are exposed to an outside environment external to the arrangement, or between a first unit of the climate control system comprised in the test chamber and a second unit of the climate control system provided on the support structure so that sides of the second unit of the climate control system other than a side of the second unit of the climate control system adjacent to the support structure are exposed to the outside environment external to the arrangement.

2. The arrangement of claim 1, wherein the container comprises a fireproof inner wall separating an interior of the freight container into the test chamber and a facility room.

3. The arrangement of claim 2, wherein all electric connections for testing the electric car components are provided to and from the test chamber through the inner wall.

4. An arrangement for testing electric components of a car, comprising:
- a transportable freight container housing at least a test chamber for testing the electric components;
- a climate control system configured to control climate conditions in the test chamber of the freight container;
- test equipment configured to test the electric components in the test chamber of the container,
- a platform constructed on a roof of the freight container, forming a support structure, and
- a roof interface between an interior of the freight container and the roof of the freight container,
- wherein the roof interface provides couplings between the test equipment inside the container and the test equipment provided on the support structure, or between a first unit of the climate control system comprised in the test chamber and a second unit of the climate control system provided on the support structure,
- wherein the container comprises a fireproof inner wall separating an interior of the freight container into the test chamber and a facility room, and
- wherein the freight container comprises an electric interface to electric input/output equipment configured to input electric inputs to an electric component under test in the test chamber, wherein the electric interface is provided as a connector or a fireproof passthrough in the inner wall.

5. The arrangement of claim 4, wherein the electric components comprise high-voltage batteries of electric cars, the arrangement further comprising the electric input/output equipment in the facility room and configured to input charge/discharge cycles to a battery under test.

6. The arrangement of claim 1, wherein a first unit of the climate control system is comprised in the test chamber and a second unit of the climate control system is provided outside the test chamber, and a coupling is provided between the first unit and the second unit.

7. The arrangement of claim 2, wherein the second unit of the climate control system is mounted or mountable on the auxiliary platform.

8. The arrangement of claim 2, further comprising a test control system disposed in the facility room and configured to control the climate control system and the test equipment according to one or more testing protocols.

9. The arrangement of claim 1, wherein the freight container further comprises an electric interface disposed in an exterior wall of the container, the electric interface suitable for testing an electric car component outside the test chamber.

10. The arrangement of claim 1, further comprising:
- at least one door providing access to the test chamber from exterior of the freight container, wherein the at least one door contacts a door frame of the freight container through an insulator, and
- a heater configured to heat a contact surface at the location of the insulator.

11. The arrangement of claim 1, further comprising a further freight container arranged in parallel with the container, wherein the freight containers are locked to each other, and wherein at least some of side walls of the freight containers that face each other are removed to provide enlarged test chamber extending at least partially over both freight containers.

12. The arrangement of claim 1, wherein at least one inlet/outlet of a safety system is provided from the test chamber directly to an exterior of the freight container.

13. The arrangement of claim 12, wherein the at least one inlet/outlet comprises a rupture panel on the roof of the freight container, and wherein the rupture panel is covered by one or more elements of the auxiliary platform.

* * * * *